(12) United States Patent
Chiba et al.

(10) Patent No.: US 6,930,440 B2
(45) Date of Patent: Aug. 16, 2005

(54) TUNING FORK TYPE CRYSTAL UNIT AND BAR TYPE CRYSTAL UNIT

(75) Inventors: Akio Chiba, Saitama (JP); Minoru Ishihara, Saitama (JP); Tamotsu Kurosawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/697,489

(22) Filed: Oct. 30, 2003

(65) Prior Publication Data

US 2004/0085004 A1 May 6, 2004

(30) Foreign Application Priority Data

Oct. 31, 2002  (JP) ........................................ 2002-317466

(51) Int. Cl.⁷ ................................................ H03H 9/21
(52) U.S. Cl. ........................ 310/370; 310/328; 310/330; 333/200
(58) Field of Search ................................ 310/328–330, 310/323.06, 370

(56) References Cited

U.S. PATENT DOCUMENTS 6,140,748 A  * 10/2000  Yang ........................... 310/370

6,523,410 B2  *  2/2003  Matsubara et al. ........ 73/504.16

FOREIGN PATENT DOCUMENTS

| JP | 62228111 A | * 10/1987 | ........... G01C/19/56 |
| JP | 11-316125 | 11/1999 | ........... G01C/19/56 |
| JP | 2002-76824 | 3/2002 | ........... H03H/9/17 |
| JP | 2002-076827 | 3/2002 | ........... H03H/9/215 |
| JP | 2002188922 A | * 7/2002 | ........... G01C/19/56 |
| JP | 2002-204141 | 7/2002 | ........... H03H/9/215 |

* cited by examiner

*Primary Examiner*—Darren Schuberg
*Assistant Examiner*—J. Aguirrechea
(74) *Attorney, Agent, or Firm*—Choate, Hall & Stewart LLP

(57) ABSTRACT

A tuning fork type quartz crystal unit has a base and a pair of arms extending from respective ends of the base in a crystallographic Y direction of quartz crystal. Each of the arms comprises a first crystal member and a second crystal member which extend in the Y direction. The first crystal member and the second crystal member are joined to each other in a crystallographic YZ plane by a direct bonding such that the first crystal member and the second crystal member have respective crystallographic X directions oriented away from each other and extending parallel to each other. Each of the arms has excitation electrodes disposed respectively on a pair of exposed surfaces thereof which lie in the YZ plane. The direct bonding comprises, for example, a siloxane bond by which the first crystal member and the second crystal member are joined to each other.

9 Claims, 6 Drawing Sheets

TUNING FORK TYPE CRYSTAL UNIT AND BAR TYPE CRYSTAL UNIT

BACKGROUND OF THE INVENTION

1. Field of the Invention

The present invention relates to a tuning fork type quartz crystal unit and a bar type quartz crystal unit, and more particularly to a tuning fork type crystal unit and a bar type crystal unit which have excellent vibration characteristics and are suitable for being reduced in size.

2. Description of the Related Art

Tuning fork type crystal units are widely used as a time reference source in wrist watches or the like. They are also used in cellular phones or the like, and there is a growing demand for reduced-size tuning fork type crystal units.

As well known in the art, three crystallographic axes X, Y, Z are defined for quartz crystals. As shown in FIG. 1, a tuning fork type crystal unit having a pair of arms 1a, 1b and base 2 is cut from a single crystal of quartz. Specifically, the tuning fork type crystal unit is cut from a Z-cut quartz plate having principal surfaces lying perpendicular to the Z-axis, such that the X-axis extends along the width of the tuning fork type crystal unit, the Y-axis along the length, and the Z-axis along the thickness. In FIG. 1, the X-axis extends horizontally, with the leftward direction being a −X direction and the rightward direction being a +X direction. Arms 1a, 1b extend in the Y direction from the respective ends of base 2 in the +X and −X directions. Each of arms 1a, 1b is in the form of a quadrangular prism, with excitation electrodes 3 disposed on respective four sides of each arm. Extension electrodes (not shown) extend from excitation electrodes 3 to base 2. In FIG. 1 and other accompanying drawings, the arrows indicated by +X, −X, Y, Z represent the directions of crystallographic axes in the quartz crystal.

On each of arms 1a, 1b, a potential is applied between a pair of excitation electrodes 3 that confront each other across the arm, and an inverse potential is applied between an adjacent pair of excitation electrodes 3. For example, if a positive potential (+) is applied between excitation electrodes 3 on the respective surfaces of arm 1a which correspond to the respective principal surfaces of the Z-cut plate and a negative potential (−) is applied between excitation electrodes 3 on the respective sides of arm 1a, then a negative potential (−) is applied between excitation electrodes 3 on the respective surfaces of the other arm 1b which correspond to the respective principal surfaces of the Z-cut plate and a positive potential (+) is applied between excitation electrodes 3 on the respective sides of arm 1b. The extension electrodes are wired to excitation electrodes 3 in order to apply those one and inverse potentials to excitation electrodes 3.

The tuning fork type crystal unit operates as follows: When the potential positive and negative potentials are applied to excitation electrodes 3 as shown in FIG. 2, an electric field is generated which is directed from the principal surfaces to side s of the Z-cut plate of arm 1a. Because of vector component P of the thus generated electric field in the +X direction, an inner side region of arm 1a is expanded in the Y direction as indicated by the single-line arrow in FIG. 3. Because of vector component Q of the generated electric field in the −X direction, an outer side region of arm 1a is contracted in the Y direction as indicated by the single-line arrow in FIG. 3. To sum up, the tuning fork type crystal unit is expanded in the Y direction when the electric field is directed from the +X direction toward the −X direction, and contracted in the Y direction when the electric field is directed from the −X direction toward the +X direction. As a result, arm 1a is tilted outward as indicated by the dual-line arrow in FIG. 3. Other arm 1b is also tilted outward as indicated by the dual-line arrow in FIG. 3 for the same reasons. Therefore, when an alternating voltage is applied to excitation electrodes 3 that are wired as described above, arms 1a, 1b cause tuning-fork vibrations at a frequency which is proportional to $W/L^2$ where W represents the width of the arm and L the length of the arm.

However, as efforts are made to reduce the size of the tuning fork type crystal unit, the tuning fork type crystal unit suffers the problem of an increased crystal impedance (CI). Specifically, as the width of arms 1a, 1b is reduced, the area of excitation electrodes 3 is also reduced, failing to apply a sufficient amount of electric field energy to the crystal unit. The failure to apply a sufficient amount of electric field energy results in an increased crystal impedance. In attempts to solve the above problem, improved tuning fork type crystal units have been proposed as disclosed in Japanese laid-open patent publications Nos. 2002-76824 and 2002-204141 (JP, P2002-76824A and JP, 2002-204141A). According to the disclosed tuning fork type crystal units, as shown in FIG. 4, groove-like recesses 4 extending in the Y direction are defined the surfaces of arms 1a, 1b which correspond to the principal surfaces of the Z-cut plate, and excitation electrodes 3 are formed on the bottoms and sides of recesses 4. The disclosed structure is effective to increase the intensity of the applied electric field and hence to reduce the crystal impedance because the arrangement of excitation electrodes 3 makes it possible to generate a linear electric field in the X direction, i.e., along the width of the crystal unit. However, inasmuch as groove-like recesses 4 are defined in the confronting surfaces of each of arms 1a, 1b and extend longitudinally in each of arms 1a, 1b, the mechanical strength of each of arms 1a, 1b is reduced, making the tuning fork type crystal unit less resistant to shocks.

SUMMARY OF THE INVENTION

It is an object of the present invention to provide a tuning fork type crystal unit which has its vibration characteristics kept well, can be reduced in size, and has an excellent shock-resistance capability.

Another object of the present invention is to provide a bar type crystal unit which has its vibration characteristics kept well, can be reduced in size, and has an excellent shock-resistance capability.

The first object of the present invention is achieved by a tuning fork type crystal unit comprising a base and a pair of arms extending from respective ends of the base in a crystallographic Y direction of quartz crystal, each of the arms comprising a first crystal member and a second crystal member which extend in the crystallographic Y direction, the first crystal member and the second crystal member being joined to each other in a crystallographic YZ plane by a direct bonding such that the first crystal member and the second crystal member have respective crystallographic X directions oriented away from each other and extending parallel to each other.

When an electric field is generated in this tuning fork type crystal unit by applying a potential to excitation electrodes on sides of each of the arms, i.e., exposed surfaces thereof in the crystallographic YZ plane, since the first crystal member and the second crystal member have their crystallographic X directions oriented away from each other, one of the first crystal member and the second crystal member is contracted while the other is expanded. Therefore, if the orientations of electric fields applied to both arms are appropriately selected, then the tuning fork type crystal unit causes tuning fork vibrations. The electric field in each arm extends parallel to the crystallographic X direction and is distributed substantially linearly. Therefore, the intensity of the electric field in each arm is increased. The tuning fork type crystal unit has a reduced crystal impedance, keeps its vibration characteristics well, and can be reduced in size.

The other object of the present invention can be accomplished by a bar type crystal unit extending in a crystallographic Y direction of quartz crystal, comprising a first crystal member and a second crystal member which extend in the crystallographic Y direction, the first crystal member and the second crystal member being joined to each other in a crystallographic YZ plane by a direct bonding such that the first crystal member and the second crystal member have respective crystallographic X directions oriented away from each other and extending parallel to each other.

The bar type crystal unit can be excited in a flexural vibration mode. In the bar type crystal unit, the generated electric field is oriented parallel to the crystallographic X direction and is distributed substantially linearly. The bar type crystal unit has a reduced crystal impedance and keeps its vibration characteristics well.

The direct bonding referred to above should preferably comprise a siloxane bond by which the first crystal member and the second crystal member are joined to each other.

DETAILED DESCRIPTION OF THE INVENTION

Figure 1:
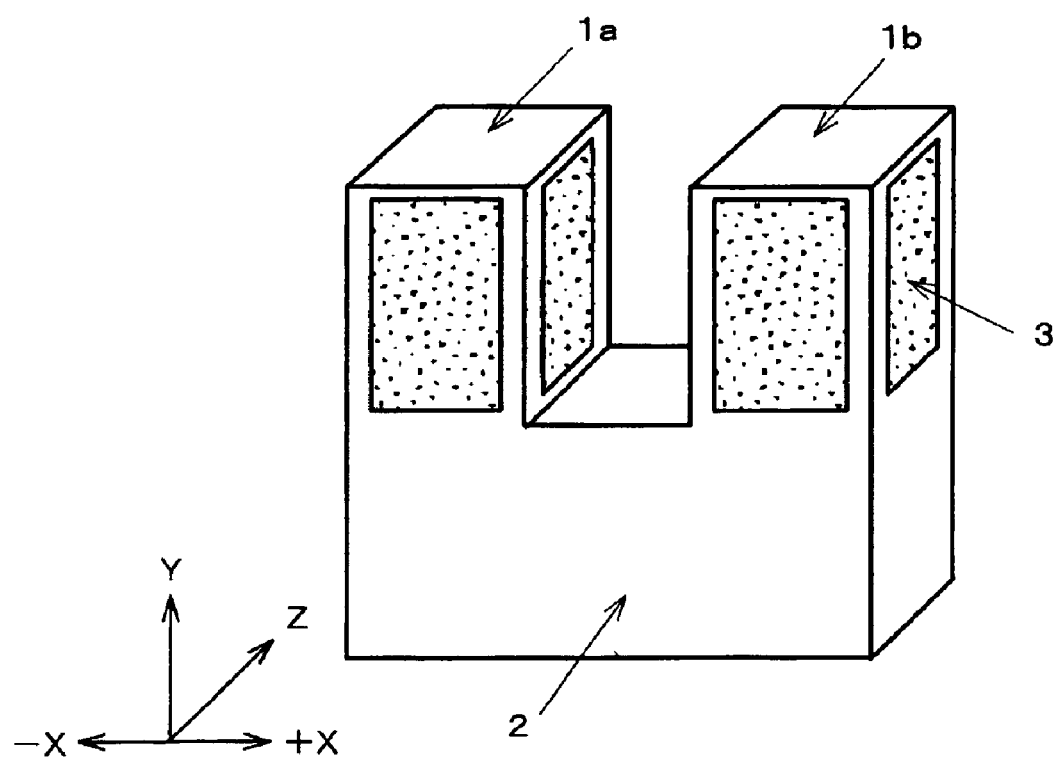
FIG. 1 is a perspective view of a conventional tuning fork type crystal unit.
Figure 2:
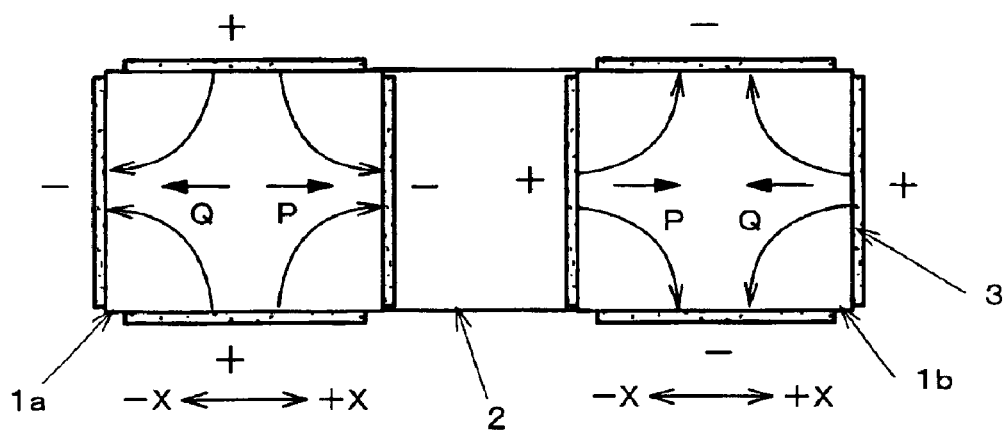
FIG. 2 is a plan view illustrating a vibration mode of the conventional tuning fork type crystal unit shown in FIG. 1.
Figure 3:
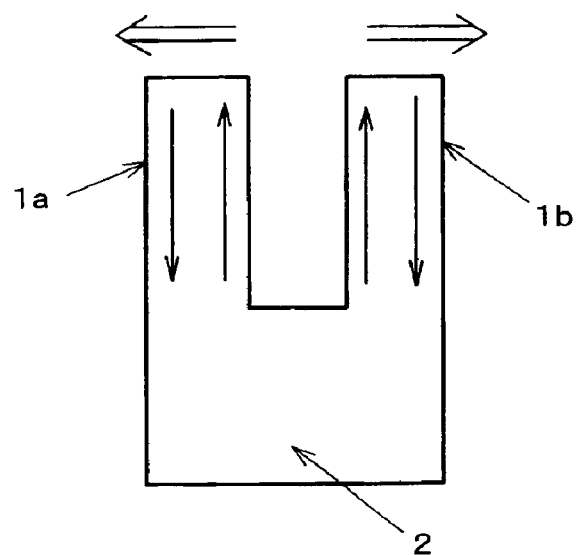
FIG. 3 is a front elevational view illustrating the vibration mode of the conventional tuning fork type crystal unit shown in FIG. 1.
Figure 4:
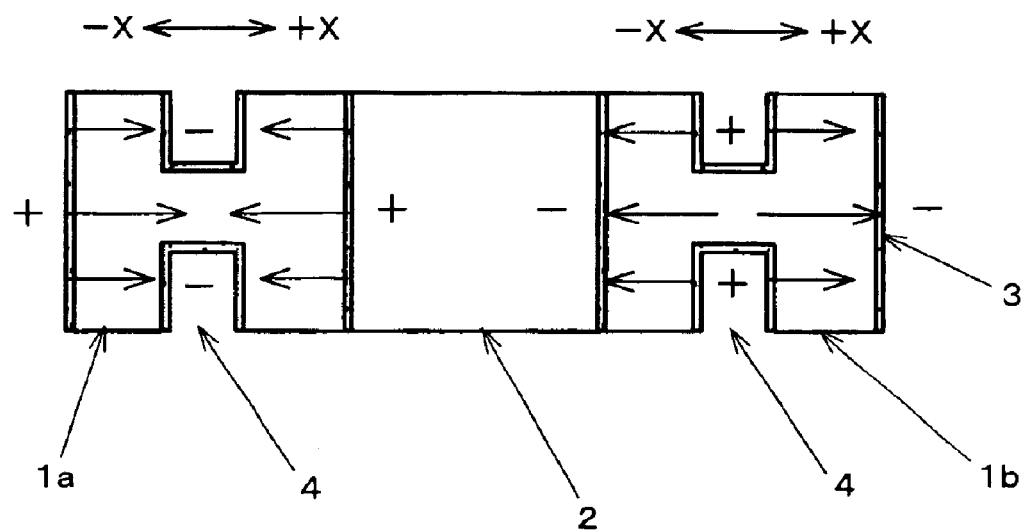
FIG. 4 is a plan view illustrating a vibration mode of another conventional tuning fork type crystal unit.
Figure 5:
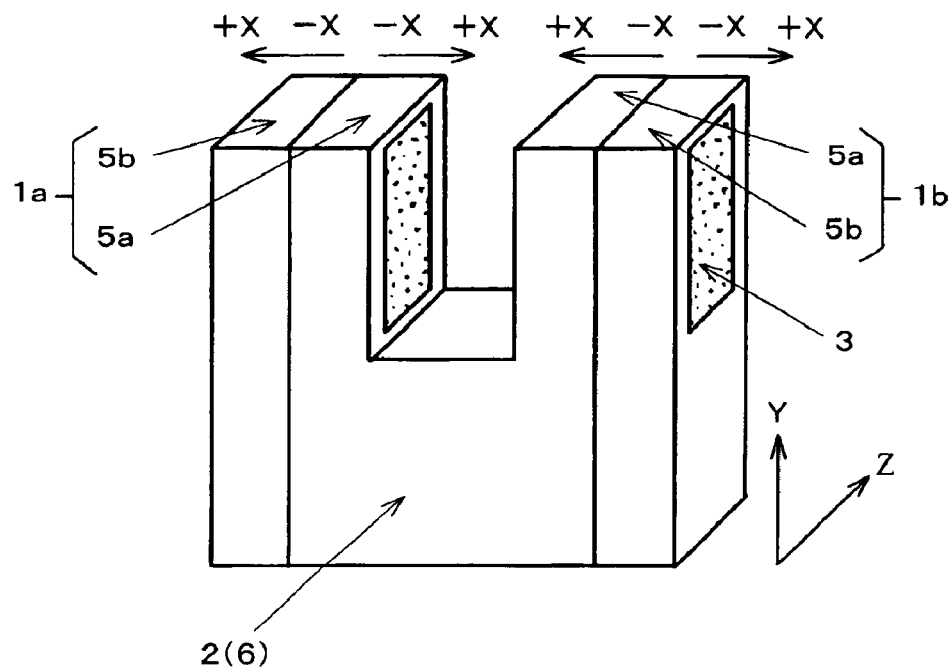
FIG. 5 is a perspective view of a tuning fork type crystal unit according to an embodiment of the present invention.

As shown in FIG. 5, a tuning fork type quartz crystal unit according to an embodiment of the present invention is constructed of a Z-cut plate of quartz crystal, and has base 2 and a pair of arms 1a, 1b extending from the respective opposite ends of base 2. The Z-cut plate of quartz crystal comprises a quartz crystal plate cut from a single crystal of quartz such that the quartz crystal plate has its principal surfaces lying perpendicular to the Z-axis of the quartz crystal. The Z-cut plate referred to in the present invention includes those Z-cut plates having principal surfaces whose normal is strictly aligned with the Z-axis and those Z-cut plates having principal surfaces whose normals extend within a range of ±10° from the Z-axis for better temperature characteristics.

Each of arms 1a, 1b comprises first crystal member 5a positioned inside, i.e., so as to face the other arm, and second crystal member 5b positioned outside, i.e., so as to face away from the other arm. If a positive direction of the X-axis of the quartz crystal is defined as a +X direction and a negative direction as a −X direction, then first crystal member 5a of each of arms 1a, 1b has its outer side in the −X direction and its inner side in the +X direction, and second crystal member 5b of each of arms 1a, 1b has its outer side in the +X direction and its inner side in the −X direction. Base 2 includes a portion comprising third crystal member 6. Each of first, second, and third crystal members 5a, 5b, 6 is cut from a Z-cut quartz plate. As shown, second crystal member 5b, first crystal member 5a, third crystal member 6, first crystal member 5a, and second crystal member 5b are joined together in the order named, by a direct bonding as described later on. A plane jointly formed by the Y-axis and Z-axis of the quartz crystal will be referred to as a YZ plane. Adjacent ones of crystal members 5a, 5b, 6 are joined to each other in the YZ plane.

Each of arms 1a, 1b has a pair of excitation electrodes 3 disposed on respective sides thereof, i.e., exposed surfaces which lie in YZ plane. Excitation electrodes 3 are wired such that one potential is applied to outer excitation electrode 3 on first arm 1a and outer excitation electrode 3 on second arm 1b and an inverse potential is applied to inner excitation electrode 3 on first arm 1a and inner excitation electrode 3 on second arm 1b. Therefore, as shown in FIG. 6, when an electric field which is directed from outside toward inside is applied across first arm 1a as indicated by the arrow P, an electric field which is also directed from outside toward inside is applied across second arm 1b as indicated by the arrow Q.

The direct bonding by which crystal members 5a, 5b, 6 are joined together will be described below. The direct bonding is achieved by a process in which two members are bonded to each other by a chemical bond between atoms on the surface of one of the members and atoms on the surface of the other member. According to the present embodiment, since the crystal members made of quartz are directly bonded to each other, a siloxane bond (Si—O—Si) is formed between those members. Details of the direct bonding are disclosed in Japanese laid-open patent publication No. 11-316125 (JP-A-11-316125), for example. In the present embodiment, the surfaces to be bonded of crystal members 5a, 5b, 6 are polished to a mirror finish, and then chemically treated so that the surfaces to be bonded are modified by a hydrophilic group, typically an —OH group (hydroxyl group). Then, the modified surfaces are temporarily joined by an optical contact, held in abutment against each other, and then heated. When they are heated, $H_2O$ is released from the hydroxyl group on both surfaces by dehydration, and a siloxane bond (Si—O—Si) is formed between the surfaces. The crystal members are now bonded at an atomic level by the siloxane bond.

Figure 6:
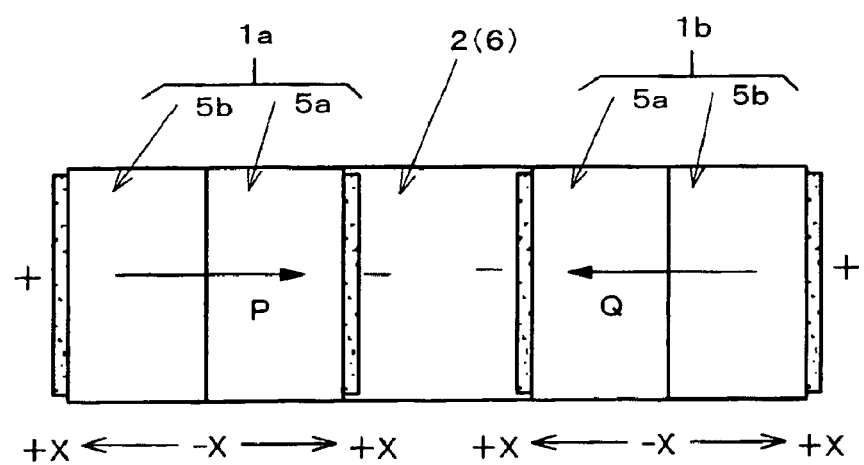
FIG. 6 is a plan view illustrating a vibration mode of the tuning fork type crystal unit shown in FIG. 5.
Figure 7:
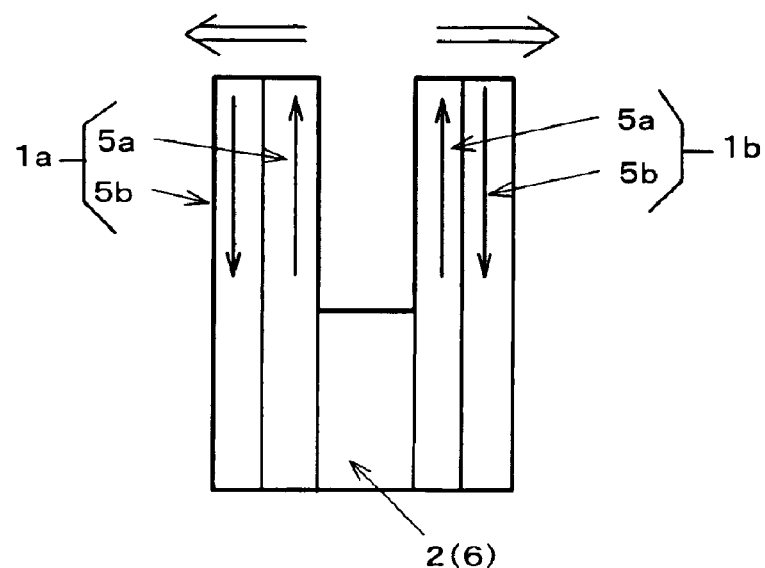
FIG. 7 is a front elevational view illustrating the vibration mode of the tuning fork type crystal unit shown in FIG. 5.

As shown in FIGS. 6 and 7, when a voltage is applied to arm 1a with a positive potential (+) on the outer side thereof and a negative potential (−) on the inner side thereof, an electric field is directed from the −X direction toward the +X direction in first crystal member 5a. Since a negative potential is developed on the X-axis of the quartz crystal, first crystal member 5a is expanded in the Y direction. An electric field is directed from the +X direction toward the −X direction in second crystal member 5b, which is contracted in the Y direction. Therefore, arm 1a is tilted outward. For the same reasons, other arm 1b is tilted outward. If the applied electric fields are reversed, then both arms 1a, 1b are tilted inward. Therefore, when an alternating voltage is applied to excitation electrodes 3 that are wired as described above, arms 1a, 1b cause tuning-fork vibrations.

Since electric fields along the X-axis are linearly applied, the tuning fork type crystal unit according to the present embodiment has a higher electric field efficiency than the conventional tuning fork type crystal unit. The tuning fork type crystal unit according to the present embodiment also has better shock resistance as no groove-like recesses are defined in the arms. As a result, the tuning fork type crystal unit according to the present embodiment has a reduced crystal impedance for higher vibration characteristics, can be reduced in size, and has an excellent shock-resistance capability. Furthermore, the excitation electrodes can easily be formed because excitation electrodes 3 are provided only on the sides of each of arms 1a, 1b, but not on the principal surfaces thereof.

Figure 8:
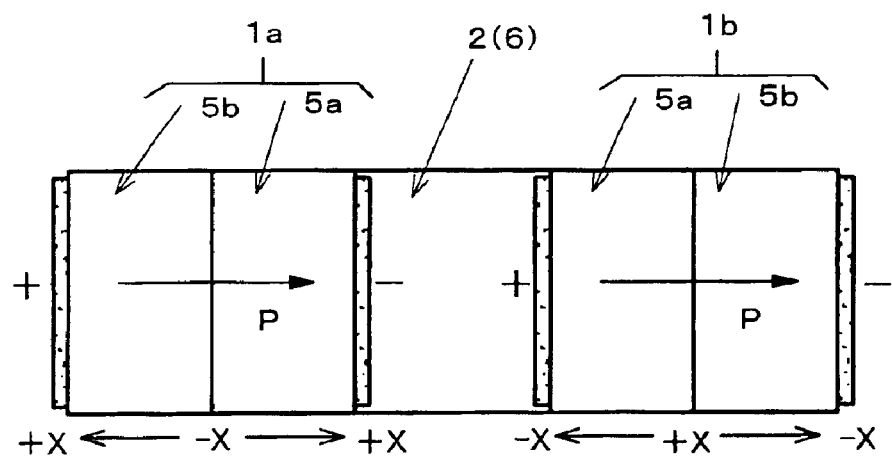
FIG. 8 is a plan view of a tuning fork type crystal unit according to another embodiment of the present invention.

The orientations of first and second crystal members 5a, 5b of each of arms 1a, 1b along the X-axis are not limited to the above orientations, but may be selected otherwise. For example, in a tuning fork type crystal unit shown in FIG. 8, second crystal member 5b of first arm 1a has its outer side in the +X direction and its inner side in the −X direction and first crystal member 5a of first arm 1a has its outer side in the −X direction and its inner side in the +X direction, as with the tuning fork type crystal unit shown in FIGS. 5 and 6, but first crystal member 5a of second arm 1b has its inner side in the −X direction and its outer side in the +X direction and second crystal member 5b of second arm 1b has its inner side in the +X direction and its outer side in the −X direction. With first crystal members 5a and second crystal members 5b being joined to each other in such a manner, the excitation electrodes are wired such that when an electric field that is directed from outside toward inside is applied to first arm 1a, an electric field that is directed from inside toward outside is applied to second arm 1b, as indicated by the arrows P in FIG. 8.

Figure 9:
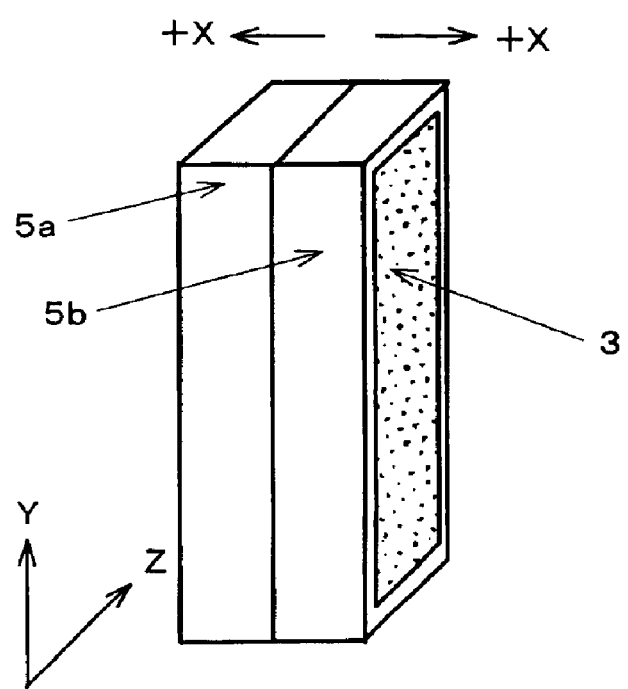
FIG. 9 is a perspective view of a bar type crystal unit according to the present invention.

In the above preferred embodiment of the present invention, the principles of the invention are applied to a tuning fork type crystal unit. However, the present invention is not limited to a tuning fork type crystal unit. In the tuning fork type crystal unit described above, since the electric field is oriented in the X direction, i.e., is distributed linearly, in each arm, the intensity of the electric field is very large in each arm. Consequently, as shown in FIG. 9, first crystal member 5a and second crystal member 5b may be joined to each other in the YZ plane by a direct bonding such that their X directions are oriented away from each other and extend parallel to each other, and excitation electrodes 3 may be disposed respectively on their outer surfaces in the YZ plane, thus providing a bar type crystal unit. The bar type crystal unit causes flexural vibrations when a potential is applied between excitation electrodes 3. The bar type crystal unit thus arranged may have its crystal impedance reduced as with the tuning fork type crystal unit. If the bar type crystal unit is to produce ordinary flexural vibrations, then a nodal region may be kept on the bar. Furthermore, if one end of the bar type crystal unit is fixed to provide a forced nodal region and the other end is used as a free end, then it is expected that when the bar type crystal unit is excited, it can vibrate well because an electric field generated in the crystal unit is linear.

What is claimed is:

1. A tuning fork type crystal unit comprising:
   a base; and
   a pair of arms extending from respective ends of said base in a crystallographic Y direction of quartz crystal;
   each of said arms comprising a first crystal member and a second crystal member which extend in said crystallographic Y direction, said first crystal member and said second crystal member being joined to each other in a crystallographic YZ plane by a direct bonding such that said first crystal member and said second crystal member have respective crystallographic X directions oriented away from each other and extending parallel to each other.

2. The crystal unit according to claim 1, wherein each of said arms has excitation electrodes disposed respectively on a pair of exposed surfaces thereof which lie in said crystallographic YZ plane.

3. The crystal unit according to claim 2, wherein said excitation electrodes are wired to cause said arms to produce tuning fork vibrations.

4. The crystal unit according to claim 1, wherein said base comprises a third crystal member, said arms and said third crystal member being joined to each other by a direct bonding.

5. The crystal unit according to claim 1, wherein said direct bonding comprises a siloxane bond by which said first crystal member and said second crystal member are joined to each other.

6. A bar type crystal unit extending in a crystallographic Y direction of quartz crystal, comprising a first crystal member and a second crystal member which extend in said crystallographic Y direction, said first crystal member and said second crystal member being joined to each other in a crystallographic YZ plane by a direct bonding such that said first crystal member and said second crystal member have respective crystallographic X directions oriented away from each other and extending parallel to each other.

7. The crystal unit according to claim 6, further comprising excitation electrodes disposed respectively on a pair of exposed surfaces of said first crystal member and said second crystal member which lie in said crystallographic YZ plane.

8. The crystal unit according to claim 6, wherein said direct bonding comprises a siloxane bond by which said first crystal member and said second crystal member are joined to each other.

9. A tuning fork type crystal unit, comprising:
   a base;
   a pair of arms extending from respective ends of said base in a crystallographic Y direction of quartz crystal, wherein each of said arms includes a first crystal member and a second crystal member which extend in said crystallographic Y direction, said first crystal member and said second crystal member being joined to each other in a crystallographic YZ plane by a direct bonding such that said first crystal member and said second crystal member have respective crystallographic X directions oriented away from each other and extending parallel to each other; and
   a pair of inner and outer electrodes disposed on exposed surfaces of each of said pair of arms which lie in said crystallographic YZ plane, wherein said electrodes are wired such that when one potential is applied to a first outer electrode on a first arm of said pair of arms and a second outer electrode on a second arm of said pair of arms, an inverse potential is applied to a first inner electrode on said first arm and a second inner electrode on said second arm.

* * * * *